(12) United States Patent
Yang et al.

(10) Patent No.: US 12,527,045 B2
(45) Date of Patent: Jan. 13, 2026

(54) SEMICONDUCTOR DEVICE, AND RELATED MODULE, CIRCUIT, AND PREPARATION METHOD

(71) Applicant: HUAWEI TECHNOLOGIES CO., LTD., Guangdong (CN)

(72) Inventors: Wentao Yang, Shanghai (CN); Loucheng Dai, Shanghai (CN); Chaofan Song, Shanghai (CN); Huiling Zuo, Shenzhen (CN); Jiang Du, Dongguan (CN); Zhaozheng Hou, Dongguan (CN); Boning Huang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 453 days.

(21) Appl. No.: 17/591,016

(22) Filed: Feb. 2, 2022

(65) Prior Publication Data
US 2022/0254877 A1    Aug. 11, 2022

(30) Foreign Application Priority Data
Feb. 7, 2021    (CN) .......................... 202110170393.0

(51) Int. Cl.
*H10D 62/10*    (2025.01)
*H10D 12/00*    (2025.01)
(52) U.S. Cl.
CPC ......... *H10D 62/112* (2025.01); *H10D 12/481* (2025.01)

(58) Field of Classification Search
CPC ............. H01L 29/7395; H01L 29/7396; H01L 29/7397
See application file for complete search history.

(56) References Cited

U.S. PATENT DOCUMENTS

| | | | |
|---|---|---|---|
| 6,524,894 B1 | 2/2003 | Nozaki et al. | |
| 6,683,343 B2 | 1/2004 | Matsudai et al. | |
| 7,538,412 B2 | 5/2009 | Schulze et al. | |
| 2010/0244093 A1* | 9/2010 | Rahimo | H10D 62/142 257/142 |

(Continued)

FOREIGN PATENT DOCUMENTS

| | | |
|---|---|---|
| CN | 101884106 A | 11/2010 |
| CN | 107431087 A | 12/2017 |

(Continued)

*Primary Examiner* — Benjamin P Sandvik
(74) *Attorney, Agent, or Firm* — WOMBLE BOND DICKINSON (US) LLP

(57) ABSTRACT

A semiconductor device, and a related module, circuit, and preparation method are disclosed. The device includes an N-type drift layer, a P-type base layer, N-type emitter layers, gates, a field stop layer, a P-type collector layer, and the like. The field stop layer includes a first doped region and a second doped region that are successively stacked on a surface of the N-type drift layer. A particle radius of an impurity in the first doped region is less than a particle radius of an impurity in the second doped region. Doping densities of both the first doped region and the second doped region are higher than a doping density of the N-type drift layer. According to the semiconductor device, a collector-emitter leakage current of an IGBT can be effectively reduced.

16 Claims, 14 Drawing Sheets

(56) References Cited

U.S. PATENT DOCUMENTS

| | | | |
|---|---|---|---|
| 2012/0267681 A1* | 10/2012 | Nemoto | H01L 29/1004 |
| | | | 257/139 |
| 2014/0070268 A1 | 3/2014 | Yoshimura et al. | |
| 2016/0197143 A1* | 7/2016 | Naito | H10D 62/127 |
| | | | 257/334 |
| 2017/0278929 A1 | 9/2017 | Imagawa | |
| 2018/0019131 A1* | 1/2018 | Suzuki | H01L 21/26513 |
| 2018/0130875 A1 | 5/2018 | Suzuki et al. | |
| 2021/0126092 A1* | 4/2021 | Kubouchi | H01L 29/0834 |
| 2022/0416063 A1* | 12/2022 | Yang | H10D 62/60 |

FOREIGN PATENT DOCUMENTS

| | | |
|---|---|---|
| JP | 2014099643 A | 5/2014 |
| JP | 2018078216 A | 5/2018 |
| JP | 2018082191 A | 5/2018 |
| WO | 2015093190 A1 | 6/2015 |

\* cited by examiner

SEMICONDUCTOR DEVICE, AND RELATED MODULE, CIRCUIT, AND PREPARATION METHOD

CROSS-REFERENCE TO RELATED APPLICATIONS

This application claims priority to Chinese Patent Application No. 202110170393.0, filed on Feb. 7, 2021, which is hereby incorporated by reference in its entirety.

TECHNICAL FIELD

The present disclosure relates to the field of semiconductor technologies, and in particular, to a semiconductor device, and a related module, circuit, and preparation method.

BACKGROUND

An insulated gate bipolar field-effect transistor (IGBT) is a composite full-control voltage-driven power semiconductor device that includes a bipolar junction transistor (BJT) and an insulated gate field-effect transistor (e.g. metal-oxide semiconductor field-effect transistor, MOSFET). The BJT has a low saturation voltage drop and a high current carrying capacity, but has a large drive current. The MOSFET has very low drive power and a large switching speed, but has a high on-state voltage drop and a low current carrying capacity. The IGBT combines advantages of the MOSFET and the BJT, and has advantages such as high input impedance, a large switching speed, good thermal stability, a simple drive circuit, a small drive current, a low saturation voltage drop, high voltage resistance, and a high current carrying capacity. Therefore, the IGBT is applicable to a converter system with a 600 V or higher direct current voltage, for example, fields such as an alternating current motor, a frequency converter, a switching power supply, a lighting circuit, and a traction and transmission.

Compared with a non-punch-through IGBT (NPT-IGBT), an N-type field stop layer (which is also referred to as an N-type buffer layer) is added to a back surface of an IGBT (namely, an FS-IGBT) having a field stop layer, and a doping density of the N-type field stop layer is slightly greater than a doping density of a substrate of the FS-IGBT. In this case, strength of an electric field may be quickly reduced, so that the overall electric field is trapezoidal, to stop the electric field and greatly reduce a required thickness of an N-type drift region. In addition, the N-type field stop layer may be further used to adjust transmit efficiency of an emitter, to improve a tailing current and a loss that exist when the IGBT is turned off.

In a conventional technology, a width of the field stop layer may be increased by forming the field stop layer by injecting a proton ($H^+$) or the like. However, a collector-emitter leakage current $I_{CES}$ of the corresponding IGBT is large at a high temperature.

SUMMARY

Embodiments of the present disclosure provide a semiconductor device, and a related module, circuit, and preparation method, to alleviate a problem of a large leakage current of a semiconductor device whose field stop layer is formed by injecting a proton ($H^+$).

According to a first aspect, an embodiment of this application provides a semiconductor device, including:

an N-type drift layer, where the N-type drift layer has a first surface and a second surface that are disposed oppositely to each other;
a P-type base layer, disposed on the first surface of the N-type drift layer;
N-type emitter layers, disposed on a surface of the P-type base layer that faces away from the N-type drift layer;
gates, where the gate is connected to the P-type base layer by using an oxide layer;
a field stop layer, where the field stop layer includes a first doped region and a second doped region that are successively stacked on the second surface of the N-type drift layer, a particle radius of an impurity in the first doped region is less than a particle radius of an impurity in the second doped region, and doping densities of both the first doped region and the second doped region are higher than a doping density of the N-type drift layer; and
a P-type collector layer, where the P-type collector layer is disposed on a surface of the N-type field stop layer that faces away from the N-type drift layer.

According to the semiconductor device, the field stop layer of the semiconductor device includes the first doped region doped with a first impurity particle with a smaller particle radius and the second doped region doped with a second impurity particle with a larger radius. Because the first impurity particle has a small size, a field stop layer with a large thickness can be implemented. An injection depth of the second impurity particle is shallow, and a very high annealing temperature is not required, so that an MOSFET structure on a front surface of an N-type substrate can be prevented from being damaged by high-temperature annealing. Therefore, according to the semiconductor device, a collector-emitter leakage current of an IGBT can be reduced while a thickness of the field stop layer is increased.

In an embodiment, the impurity in the first doped region is a hydrogen ion or a helium ion, and the impurity in the second doped region is a phosphorus atom or an arsenic atom. It should be understood that the hydrogen ion ($H^+$) or the helium ion ($He^+$) may be injected into a depth of the N-type substrate by using small injection energy. This greatly increases the thickness of the field stop layer.

In an embodiment, a thickness of the first doped region is greater than a thickness of the second doped region. A larger thickness of the first doped region indicates a larger thickness of the field stop layer. This can reduce a tailing current and a loss that exist when the IGBT is turned off.

In an embodiment, the thickness of the first doped region is 5 micrometers to 50 micrometers, and the thickness of the second doped region is 2 micrometers to 10 micrometers.

In an embodiment, the doping density of the first doped region substantially decreases in a direction away from the P-type collector layer.

It should be understood that a larger doping density of the impurity particle at the field stop layer indicates a larger change rate of an electric field. When gradient doping is used and the IGBT is turned off, the change rate of the electric field at the field stop layer is first small and then large. This can reduce voltage stress existing when the IGBT is turned off, to improve voltage resistance of the device.

In an embodiment, the doping density of the second doped region substantially decreases in the direction away from the P-type collector layer.

In an embodiment, the gate passes through the N-type emitter layer and the P-type base layer. In this case, the semiconductor device is a trench-type IGBT. Compared with a planar-type IGBT, the trench-type IGBT can greatly reduce an on-state voltage drop without increasing a loss existing during turn-off. Three main reasons are as follows: (1) Compared with the planar-type IGBT, the trench-type IGBT eliminates a JFET effect. (2) At a position near an emitter, a carrier density of the trench-type IGBT is far higher than a carrier density of the planar-type IGBT. In addition, in the trench-type IGBT, a proper trench width and gap may improve a carrier density at a layer near a surface of the N⁻ drift layer, to reduce a resistance of the N⁻ drift region. (3) Compared with the planar-type IGBT, a vertical structure of the trench-type IGBT omits an area for producing a conductive channel on a silicon surface, to further facilitate a compact cell design. In other words, more IGBT cells may be produced on a same chip area. Therefore, this increases a width of the conductive channel and reduces a channel resistance.

In an embodiment, the gate is disposed on the surface of the P-type base layer that faces away from the N-type drift layer.

According to a second aspect, an embodiment of this application further provides a semiconductor device preparation method, including:

providing an N-type substrate, where the N-type substrate includes a first surface and a second surface that are disposed oppositely to each other;

forming a P-type base layer, N-type emitter layers, an oxide layer, and gates on the first surface, where the P-type base layer is disposed on the first surface of the N-type substrate, the N-type emitter layers are disposed on a surface of the P-type base layer that faces away from the N-type substrate, and the gate is connected to the P-type base layer by using the oxide layer;

injecting a first impurity particle and a second impurity particle into the second surface, where a particle radius of the first impurity particle is greater than a particle radius of the second impurity particle, and an injection depth of the first impurity particle is greater than an injection depth of the second impurity particle; and forming a P-type collector layer on the second surface.

In the semiconductor device preparation method provided in this embodiment of this application, a field stop layer of a semiconductor device is formed by injecting both the first impurity particle and the second impurity particle. The injection depth of the second impurity particle is shallow, and a very high annealing temperature is not required. Therefore, an MOSFET structure on a front surface of the N-type substrate can be prevented from being damaged. In addition, a decrease of a large quantity of beneficial defects introduced by injecting the first impurity particle can be avoided, and a collector-emitter leakage current of the device can be reduced.

In an embodiment, an impurity in a first doped region is an H ion or a helium ion, and an impurity in a second doped region is a phosphorus atom or an arsenic atom. It should be understood that the hydrogen ion (H⁺) or the helium ion (He⁺) may be injected into a depth of the N-type substrate by using small injection energy. This greatly increases a thickness of the field stop layer.

In an embodiment, the injecting a first impurity particle and a second impurity particle into the second surface includes:

injecting the first impurity particle into the second surface by using first injection energy; and injecting the second impurity particle into the second surface by using second injection energy, where the first injection energy and the second injection energy enable the injection depth of the first impurity particle to be greater than the injection depth of the second impurity particle.

In an embodiment, the injection depth of the first impurity particle is 5 micrometers to 50 micrometers, and the injection depth of the second impurity particle is 2 micrometers to 10 micrometers.

A larger thickness of the first doped region indicates a larger thickness of the field stop layer. This can reduce a tailing current and a loss that exist when the device is turned off.

In an embodiment, larger first injection energy indicates a smaller injection density of the first impurity particle. In this method, a doping density of the first impurity particle may substantially decrease in a direction away from the second surface, that is, gradient doping or substantial gradient doping of the first impurity particle is implemented. Gradient doping may reduce voltage stress existing when the device is turned off, to improve voltage resistance of the device, and may further reduce stress generated on the N-type substrate 1 due to doping, to improve performance and a yield of the device.

In an embodiment, larger first injection energy indicates a smaller injection density of the first impurity particle.

Similarly, in the method, a doping density of the second impurity particle may substantially decrease in a direction away from the second surface, that is, gradient doping or substantial gradient doping of the second impurity particle is implemented. Gradient doping may reduce voltage stress existing when the device is turned off, to improve voltage resistance of the device, and may further reduce stress generated on the N-type substrate due to doping, to improve performance and a yield of the device.

In an embodiment, after the injecting a first impurity particle and a second impurity particle into the second surface, the method further includes:

annealing the N-type substrate into which the first impurity particle and the second impurity particle are injected.

In an embodiment, a maximum temperature of the annealing is 200° C. to 500° C.

According to a third aspect, an embodiment of this application further provides a power module, where the power module may include at least one semiconductor device in any one of the first aspect or the implementations of the first aspect, or at least one semiconductor device that is prepared by using the method in any one of the second aspect or the implementations of the second aspect.

For example, the semiconductor device is an IGBT, and the power module may be an IGBT discrete device, an IGBT module, an intelligent power module (intelligent power module, IPM), or the like.

According to a fourth aspect, an embodiment of this application further provides a power conversion circuit, including at least one semiconductor device in any one of the first aspect or the implementations of the first aspect, or at least one semiconductor device that is prepared by using the method in any one of the second aspect or the implementations of the second aspect.

The power conversion circuit is a circuit configured to implement functions such as frequency conversion, conversion, phase change, rectification, inversion, and switching on a voltage/current. The power conversion circuit may be an inverter circuit (inverter circuit), a rectifier circuit (rectifier), a converter circuit, or the like.

BRIEF DESCRIPTION OF DRAWINGS

The following briefly describes the accompanying drawings required for describing embodiments.

DESCRIPTION OF EMBODIMENTS

Figure 1:
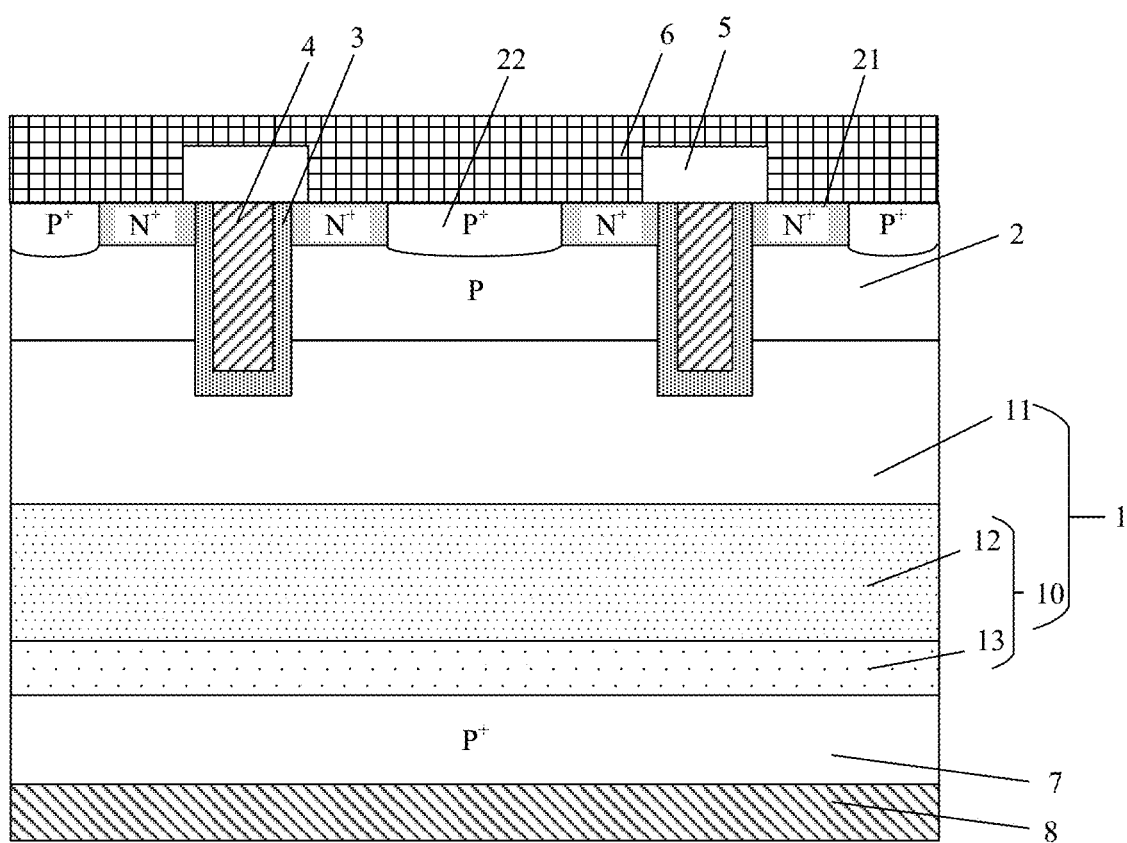
FIG. 1 is a schematic cross-sectional diagram of a trench-type IGBT according to an embodiment of this application.

First, some key terms in the embodiments of this application are described.

(1) N-type semiconductor: A negative (N) type is an electron type. A semiconductor that is conductive based on an electron is referred to as an N-type semiconductor. The N-type semiconductor is obtained by doping an intrinsic semiconductor with a donor impurity. For example, pure silicon is doped with a small quantity of group V elements (phosphorus, arsenic, or the like), and the phosphorus forms covalent bonds with surrounding group IV silicon atoms to produce an extra free electron. The N type may further fall into an $N^+$ type (an electron-sufficient type) and an $N^-$ type (an electron-insufficient type), and a doping density of an $N^+$-type semiconductor is greater than a doping density of an $N^-$-type semiconductor. It should be understood that the $N^+$ type (the electron-sufficient type) and the $N^-$ type (the electron-insufficient type) are relative to each other.

In this application, an N-type drift layer, an $N^-$-type drift layer, an N-type emitter layer, an $N^+$-type emitter layer, an N-type substrate, and the like are all N-type semiconductors.

(2) P-type semiconductor: A positive (P) type is a hole type. A semiconductor that is conductive based on a hole is referred to as a P-type semiconductor. The P-type semiconductor is obtained by doping an intrinsic semiconductor with an acceptor impurity. For example, when pure silicon is doped with a small quantity of group III elements (boron, indium, or the like), and the boron forms covalent bonds with surrounding group IV silicon atoms to form a hole that lacks an electron. The P type may further fall into a $P^+$ type (a hole-sufficient type) and a $P^-$ type (a hole-insufficient type), and a doping density of a $P^+$-type semiconductor is greater than a doping density of a $P^-$-type semiconductor.

In this application, a P-type base layer, a $P^-$-type base layer, a $P^+$-type base region, a P-type collector layer, a $P^+$-type collector layer, and the like are all P-type semiconductors.

(3) An IGBT has performance parameters. Different manufacturers specify ranges of these parameters in corresponding specifications, and the parameters are required to be limited to minimum or maximum limit capabilities or limit conditions of the parameters in a use process. The parameters cannot exceed a highest or lowest rated value in a working process of the IGBT. Main parameters are as follows:

A gate-emitter critical voltage (Collector-Emitter blocking voltage) $BV_{CES}$ is a collector-emitter maximum voltage when short-circuiting occurs between a gate and an emitter.

A gate-emitter maximum voltage (Gate-Emitter voltage) $V_{GES}$ is a voltage when short-circuiting occurs between a collector and the emitter.

An allowed maximum collector direct current (Continuous collector current) is usually represented by using $I_C$, and generally means a direct current value required when a junction temperature rises from a case temperature of 25° C. to a maximum junction temperature of 150° C.

Under a transient condition, the IGBT can carry a peak current (Peak collector repetitive current) that is higher than the maximum continuous current of the IGBT and that is usually represented by using $I_{CM}$.

Power dissipation (Maximum power dissipation) required when the junction temperature rises from the case temperature of 25° C. to the maximum value of 150° C. is denoted as $P_D$.

An allowed temperature range (Junction temperature) of the junction temperature of the IGBT during working is usually represented by using $T_j$.

When short-circuiting occurs between the gate and the emitter, a leakage current (Collector-Emitter leakage current) existing when a specified voltage and a specified temperature are applied between the collector and the emitter is usually represented by using $I_{CES}$.

A gate-emitter threshold voltage (Gate-Emitter threshold voltage) is usually represented by using $V_{GE(th)}$, and the IGBT is turned on within the voltage range. The threshold voltage has a negative temperature coefficient. The threshold voltage increases linearly with a thickness of a gate oxide layer, and is directly proportional to a square root of a doping density of a P-type base region. A fixed surface charge in an interface between oxide and silicon and a moveable ion at the gate oxide layer may cause offset of the threshold voltage.

In case of a specified collector current and a specified gate voltage, a collector-emitter voltage (Collector-Emitter saturation voltage) is usually represented by using $V_{CE(SAT)}$.

When short-circuiting occurs between the collector and the emitter, a measured input capacitance (Input capacitance) $C_{ies}$ is a sum of a gate-emitter capacitance and a Miller capacitance, and the gate-emitter capacitance is much greater than the Miller capacitance.

A collector-emitter capacitance (Output capacitance) $C_{oes}$ existing when short-circuiting occurs between the gate and the emitter has typical PN junction voltage dependence.

The gate-collector Miller capacitance (Reverse transfer capacitance) $C_{res}$ has complex voltage dependence.

A first reason that $I_{CES}$ is used as a key parameter is as follows: $I_{CES}$ is a leakage current that exists when the IGBT is turned off and that flows from the collector to the emitter in case of a specified collector-emitter voltage and a specified gate-emitter voltage, and directly affects a leakage loss of a device in a standby mode. The leakage loss is obtained by multiplying a value of $I_{CES}$ by the collector-emitter voltage. As the leakage current increases with a temperature, a standard for $I_{CES}$ is specified at both a room temperature and a high temperature. A second reason is as follows: When a thermal resistance of the device and an ambient temperature of the device remain unchanged, larger $I_{CES}$ indicates larger power consumption and a larger junction temperature of the device.

The following describes a semiconductor device in an embodiment of this application. The semiconductor device may be referred to as a power semiconductor device, an IGBT device, an IGBT chip, or the like, and may include one or more IGBTs.

Figure 2:
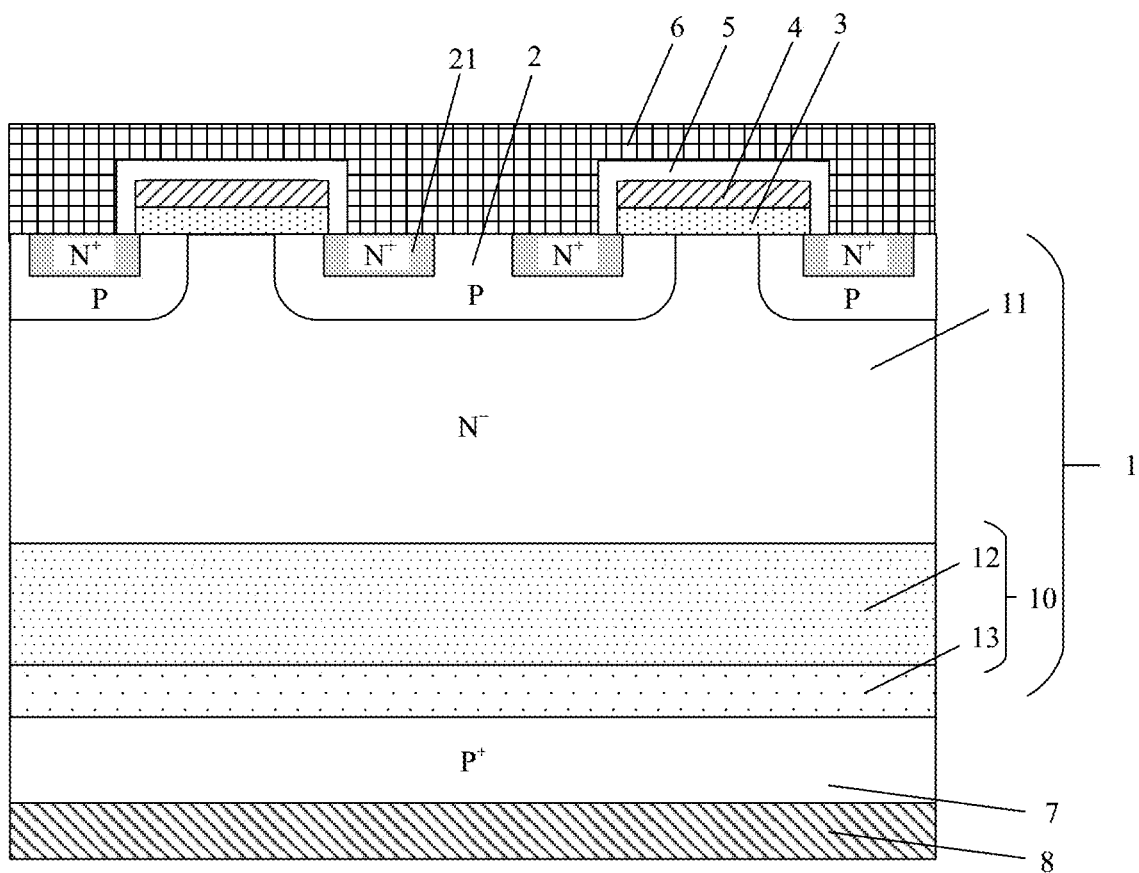
FIG. 2 is a schematic cross-sectional diagram of a planar-type IGBT according to an embodiment of this application.

FIG. 1 and FIG. 2 are schematic cross-sectional diagrams of two IGBTs according to an embodiment of this application. FIG. 1 shows a trench-type IGBT, and FIG. 2 shows a planar-type IGBT. As shown in FIG. 1 and FIG. 2, the IGBT may include some or all layer structures in an N-type drift layer 11, a P-type base layer 2, N-type emitter layers 21, an oxide layer 3, gates 4, a dielectric layer 5, an emitter 6, a field stop layer 10, a P-type collector layer 7, a collector 8, and the like.

Both the N-type drift layer 11 and the field stop layer 10 belong to an N-type substrate 1. The field stop layer 10 is formed by injecting an impurity particle into a back surface (a surface near the collector 8) of the N-type substrate 1, and has a higher doping density than the N-type drift layer 11. Therefore, the field stop layer 10 is also referred to as an $N^+$ field stop layer 10, and the N-type drift layer 11 is also referred to as an $N^-$ drift layer 11.

The N-type drift layer 11 is a part of the N-type substrate 1, and has a first surface and a second surface that are disposed oppositely to each other. The P-type base layer 2 is disposed on the first surface of the N-type drift layer 11. The first surface of the N-type drift layer 11 may be a first surface or a front surface of the N-type substrate 1, and the P-type base layer 2 may be an epitaxial layer of the N-type substrate 1. Alternatively, the front surface of the N-type substrate 1 may be a surface of the P-type base layer 2 that faces away from the N-type drift layer 11. In this case, the P-type base layer 2 is formed by injecting an impurity into the front surface of the N-type substrate 1. Herein, a surface of the N-type substrate 1 that is near the collector 8 is referred to as a second surface or the back surface of the N-type substrate 1. The first surface and the second surface of the N-type substrate 1 are two surfaces of the N-type substrate 1 that are opposite to each other.

The N-type emitter layers 21 are disposed on the surface of the P-type base layer 2 that faces away from the N-type drift layer, and may be formed by injecting an impurity. The N-type emitter layers 21 are disposed at intervals on the P-type base layer 2. In an embodiment, on the P-type base layer 2, a $P^+$-type base region 22 may be further included between two N-type emitter layers 21 of the IGBT. In this case, the P-type base layer 2 may also be referred to as a $P^-$-type base layer 2.

The oxide layer 3 covers the P-type base layer 2, and the gate 4 is connected to the P-type base layer 2 by using the oxide layer 3. In this way, when a voltage $V_{GS}$ greater than a critical value $V_{GES}$ is applied between the gate 4 and the emitter 6, a channel for connecting the N-type emitter layer 21 and the N-type drift layer 11 may be formed at a position at the P-type base layer 2 that is adjacent to the oxide layer 3.

The IGBT may fall into a trench-type IGBT and a planar-type IGBT based on different positions of the gate 4.

In a semiconductor device shown in FIG. 1, the IGBT in the semiconductor device is a trench-type IGBT, and the gate 4 passes through the N-type emitter layer 21 and the P-type base layer 2.

In a semiconductor device shown in FIG. 2, the IGBT in the semiconductor device is a planar-type IGBT, and the gate 4 is disposed on the surface of the P-type base layer 2 that faces away from the N-type drift layer 11.

Compared with the planar-type IGBT, the trench-type IGBT can greatly reduce an on-state voltage drop without increasing a loss existing during turn-off. Three main reasons are as follows: (1) Compared with the planar-type IGBT, the trench-type IGBT eliminates a JFET effect. (2) At a position near the emitter, a carrier density of the trench-type IGBT is far higher than a carrier density of the planar-type IGBT. In addition, in the trench-type IGBT, a proper trench width and gap may improve a carrier density at a layer near a surface of the $N^-$ drift layer, to reduce a resistance of the $N^-$ drift region. (3) Compared with the planar-type IGBT, a vertical structure of the trench-type IGBT omits an area for producing a conductive channel on a silicon surface, to further facilitate a compact cell design. In other words, more IGBT cells may be produced on a same chip area. Therefore, this increases a width of the conductive channel and reduces a channel resistance.

A doping density of the field stop layer 10 is slightly higher than a doping density of the N-type substrate 1. Introduction of the field stop layer 10 may quickly reduce strength of an electric field, so that the overall electric field is trapezoidal, to stop the electric field and greatly reduce a required thickness of the $N^-$ drift region 11. In addition, the field stop layer 10 may be further used to adjust transmit efficiency of the $P^+$ emitter layer 21, to change a tailing current and a loss that exist during turn-off. Within a specific range, if the field stop layer is thicker, voltage stress existing in a process of turning off the IGBT can be reduced, to improve voltage resistance of the device.

The P-type collector layer 7 is disposed on a surface of the N-type field stop layer 10 that faces away from the N-type drift layer 11. The collector 8 is disposed on a surface of the P-type collector layer 7 that faces away from the N-type field stop layer 10.

To reduce a collector-emitter leakage current while increasing a thickness of the field stop layer 10, this embodiment of this application provides a field stop layer 10 having a plurality of layer structures, including a first doped region 12 and a second doped region 13 that are successively stacked on the second surface of the N-type drift layer 11. A particle radius of an impurity (also referred to as a first impurity particle) in the first doped region 12 is less than a particle radius of an impurity (also referred to as a second impurity particle) in the second doped region 13, and doping densities of both the first doped region 12 and the second doped region 13 are higher than a doping density of the N-type drift layer 11.

The impurity in the first doped region 12 is formed by injecting the first impurity particle into the back surface of the N-type substrate 1. Similarly, the impurity in the second doped region 13 is formed by injecting the second impurity particle into the back surface of the N-type substrate 1.

The field stop layer of the semiconductor device may be formed by injecting both the first impurity particle with a smaller particle radius and the second impurity particle with a larger radius. Because the first impurity particle has a small size, a field stop layer with a large thickness can be implemented. An injection depth of the second impurity particle is shallow, and a very high annealing temperature is not required, so that an MOSFET structure on the front surface of the N-type substrate can be prevented from being damaged by high-temperature annealing. Therefore, according to the semiconductor device provided in this application, the collector-emitter leakage current of the IGBT can be reduced while the thickness of the field stop layer is increased.

In some embodiments, the first impurity particle is a hydrogen ion ($H^+$) or a helium ion ($He^+$), and the impurity in the second doped region is a group V atom such as a phosphorus atom or an arsenic atom. The hydrogen ion ($H^+$) or a helium ion ($He^+$) may be injected into a depth of the N-type substrate 1 by using small injection energy. This greatly increases the thickness of the field stop layer.

In some embodiments, a thickness of the first doped region 12 is greater than a thickness of the second doped region 13. For example, the thickness of the first doped region 12 is 5 micrometers to 50 micrometers, and the thickness of the second doped region 13 is 2 micrometers to 10 micrometers. A larger thickness of the first doped region 12 indicates a larger thickness of the field stop layer. This can reduce the tailing current and the loss that exist when the IGBT is turned off.

In some embodiments, the doping density of the first doped region 12 decreases or substantially decreases in a direction away from the P-type collector layer 7, namely, decreases or substantially decreases with an injection depth of the first doped particle. Herein, the depth is a distance from the impurity particle to the back surface of the N-type substrate 1.

In some embodiments, the doping density of the second doped region 13 decreases or substantially decreases in the direction away from the P-type collector layer 7, namely, decreases or substantially decreases with the injection depth of the second doped particle.

It should be understood that a larger doping density of the impurity particle at the field stop layer 10 indicates a larger change rate of the electric field. When gradient doping is used and the IGBT is turned off, the change rate of the electric field at the field stop layer 10 is first small and then large. This can reduce the voltage stress existing when the IGBT is turned off, to improve the voltage resistance of the device.

It should be further understood that, a larger doping density indicates a larger quantity of free electrons at the field stop layer 10. When the IGBT is turned off, these electrons recombines with more holes at the P-type collector layer 7 per unit of time. In this case, a current changes quickly, causing larger voltage stress. Large voltage stress may cause poor voltage resistance of the device. When gradient doping is used, doping densities successively decrease in a direction from the P-type collector layer 7 to the field stop layer 10, so that the current can first change quickly and then change slowly. This reduces, without affecting a turn-off speed, the voltage stress existing when the IGBT is turned off, to improve the voltage resistance of the device.

It should be noted that the doping density of the first doped region 12 or the doping density of the second doped region 13 may not decrease in the direction away from the P-type collector layer 7. This is not limited herein.

Figure 3:
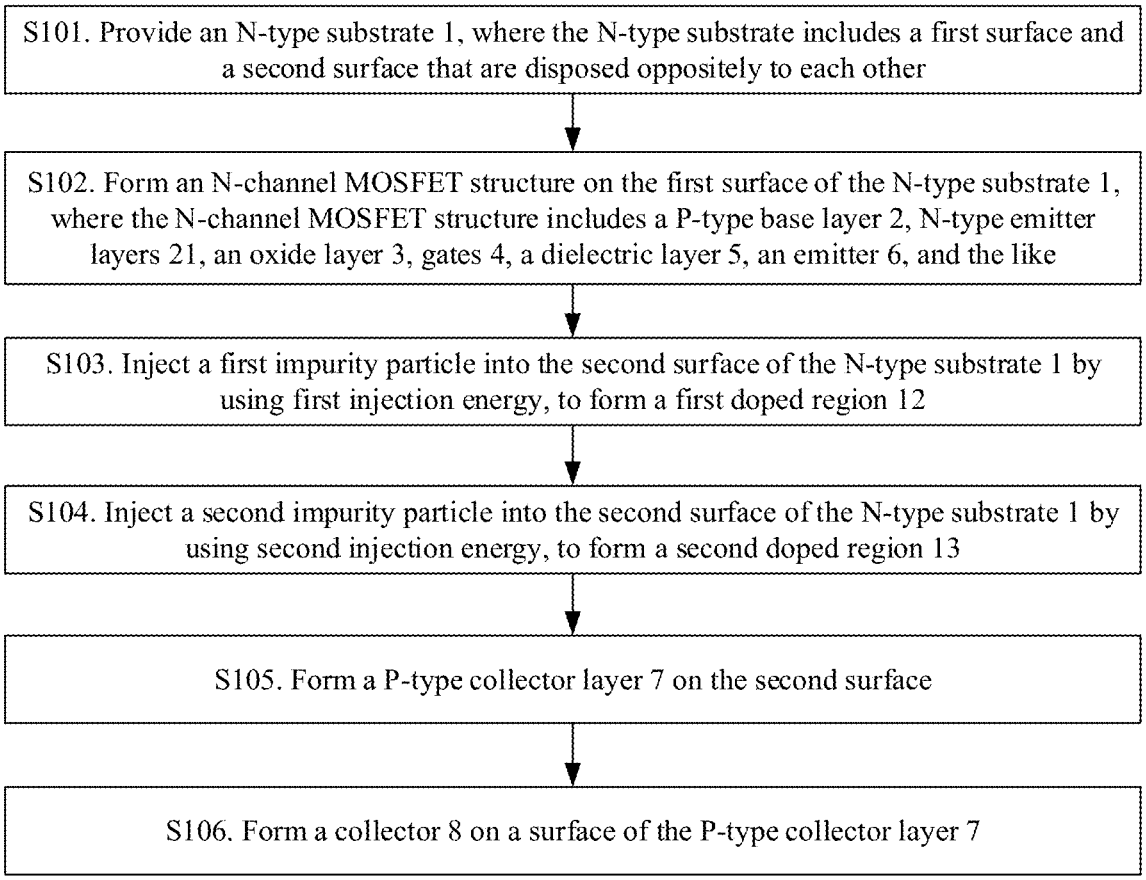
FIG. 3 is a schematic flowchart of a semiconductor device preparation method according to an embodiment of this application.

With reference to a schematic flowchart of an IGBT preparation method shown in FIG. 3 and schematic cross-sectional diagrams of some IGBT preparation processes shown in FIG. 4A to FIG. 4E, the following describes an IGBT preparation method provided in an embodiment of this application. The method may be used to prepare the IGBTs shown in FIG. 1 and FIG. 2, and the method may include the following operations that impose no limitation.

Operation S101. Provide an N-type substrate 1, where the N-type substrate includes a first surface and a second surface that are disposed oppositely to each other. References can be made to FIG. 4A.

Operation S102. Form an N-channel MOSFET structure on the first surface of the N-type substrate 1, where the N-channel MOSFET structure includes a P-type base layer 2, N-type emitter layers 21, an oxide layer 3, gates 4, a dielectric layer 5, an emitter 6, and the like. The dielectric layer 5 and the emitter 6 are not layer structures necessary for the N-channel MOSFET structure. In some embodiments, the semiconductor device may not include the dielectric layer 5 and the emitter 6. The IGBT may fall into a trench-type IGBT and a planar-type IGBT based on different positions of the gate in the N-channel MOSFET structure.

Based on the preparation technologies of the trench-type IGBT and the planar-type IGBT, the following separately describes a method for forming the N-channel MOSFET structure on the first surface of the N-type substrate 1.

In some embodiments, the prepared semiconductor device is a trench-type IGBT.

Figure 4A:
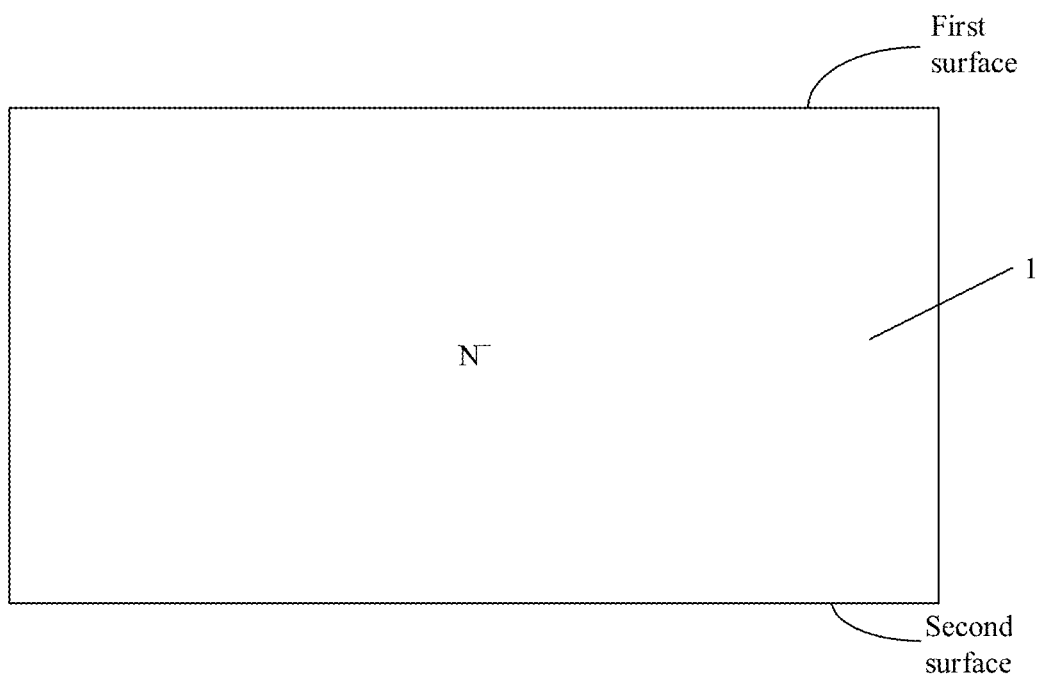
FIG. 4A to FIG. 4E are schematic cross-sectional diagrams of some semiconductor device preparation processes according to an embodiment of this application.
Figure 4B:
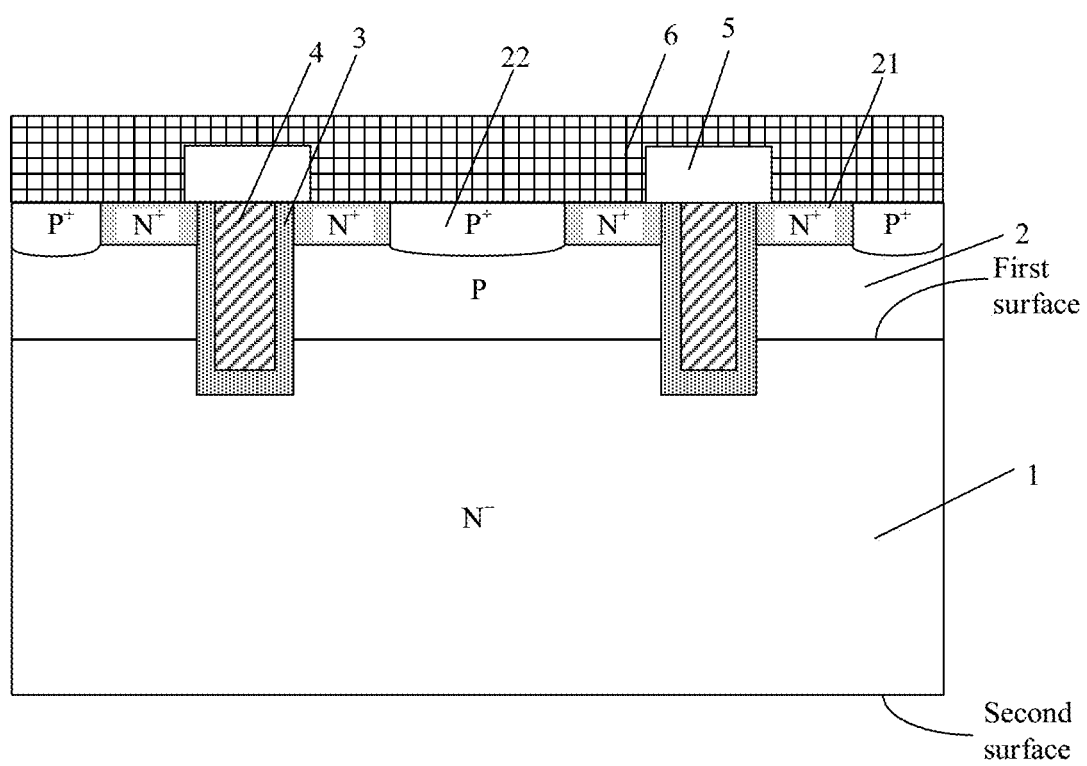

Referring to FIG. 4B, the method for forming the N-channel MOSFET structure on the first surface of the N-type substrate 1 may be as follows:

Operation S1021. Form a P-type base layer 2 on the first surface of the N-type substrate 1.

The P-type base layer 2 may be prepared in a plurality of manners. For example, the P-type base layer 2 may be formed on the first surface of the N-type substrate 1 through epitaxial growth, or a P well is formed by injecting an impurity into the first surface of the N-type substrate 1, and the P well is the P-type base layer 2.

Operation S1022. Inject an impurity on a part of a surface of the P-type base layer 2 that faces away from the N-type substrate, to form N-type emitter layers 21 that are disposed at intervals. The N-type emitter layer 21 forms a source region of the IGBT.

Operation S1023. Form trenches that pass through the P-type base layer 2.

Operation S1024. Form an oxide layer 3 on inner walls of the trenches, and fill a conductive material in the trenches including the oxide layer 3, to form gates 4. In this case, the gate 4 is connected to the P-type base layer 2 by using the oxide layer 3. In this way, when a voltage $V_{GS}$ greater than a critical value $V_{GES}$ is applied between the gate 4 and an emitter 6, a channel for connecting the N-type emitter layer 21 and an N-type drift layer 11 may be formed at a position at the P-type base layer 2 that is adjacent to the oxide layer 3.

Operation S1025. Form a dielectric layer 5 and the emitter 6 on a surface of the gate 4, where the dielectric layer 5 is configured to isolate the gate 4 from the emitter 6, and the emitter 6 is connected to the N-type emitter layer 21.

In an embodiment, P$^+$-type base regions 22 may be further formed on the surface of the P-type base layer 2 that faces away from the N-type substrate, and the P$^+$-type base region 22 may be located between two adjacent N-type emitter layers 21.

Figure 4C:
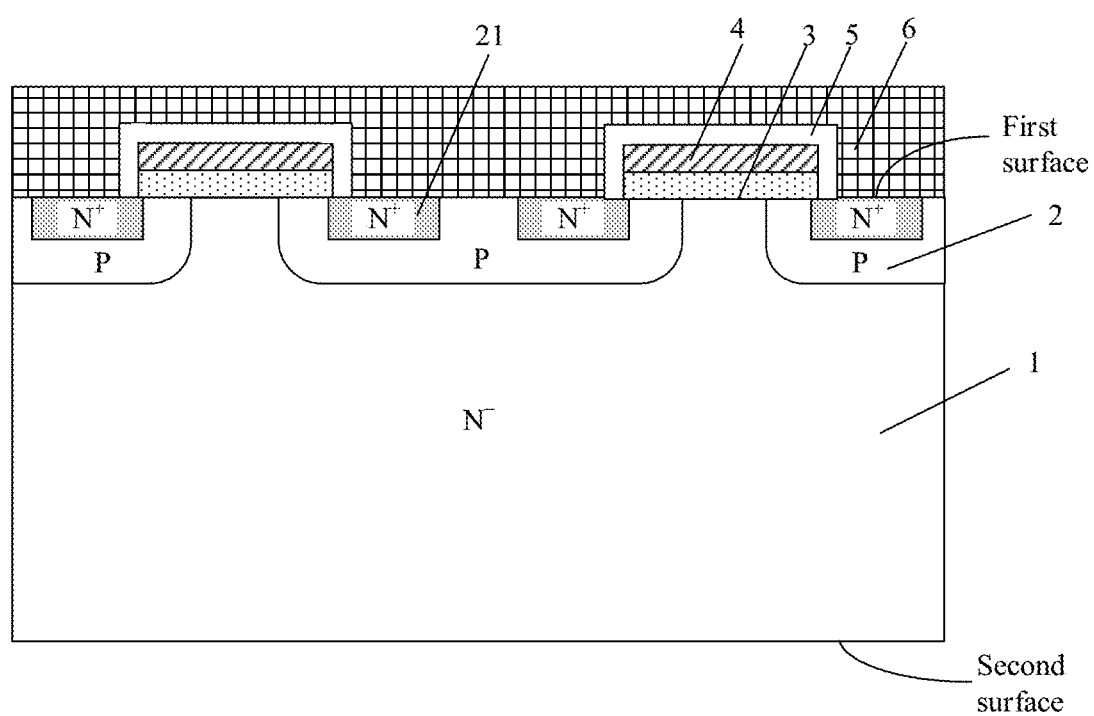

In some embodiments, the prepared semiconductor device is a planar-type IGBT. Referring to FIG. 4C, the method for forming the N-channel MOSFET structure on the first surface of the N-type substrate 1 may be as follows:

Operation S1026. Form a P-type base layer 2 on the first surface of the N-type substrate 1. For example, a P well is formed by injecting an impurity into the first surface of the N-type substrate 1, and the P well is the P-type base layer 2.

Operation S1027. Inject an impurity on a part of a surface of the P-type base layer 2 that faces away from the N-type substrate, to form N-type emitter layers 21 that are disposed at intervals.

Operation S1028. Successively form an oxide layer 3 and gates 4 on the surface of the P-type base layer 2 that faces away from the N-type substrate. The oxide layer 3 covers the P-type base layer 2, and the gate 4 is connected to the P-type base layer 2 by using the oxide layer 3. In this way, when a voltage $V_{GS}$ greater than a critical value $V_{GES}$ is applied between the gate 4 and an emitter 6, a channel for connecting the N-type emitter layer 21 and an N-type drift layer 11 may be formed at a position at the P-type base layer 2 that is adjacent to the oxide layer 3.

Operation S1029. Form a dielectric layer 5 and the emitter 6 on a surface of the gate 4, where the dielectric layer 5 is configured to isolate the gate 4 from the emitter 6, and the emitter 6 is connected to the N-type emitter layer 21.

It should be noted that the foregoing layer structures may be prepared by using a photolithography technology and a thin film preparation technology. This is not limited herein.

It should be further noted that FIG. 4B and FIG. 4C impose no limitation, and another structure and another preparation method may be included. This is not limited in this embodiment of this application.

Operation S103. Inject a first impurity particle into the second surface of the N-type substrate by using first injection energy, to form a first doped region 12.

Operation S104. Inject a second impurity particle into the second surface of the N-type substrate by using second injection energy, to form a second doped region 13.

Figure 4D:
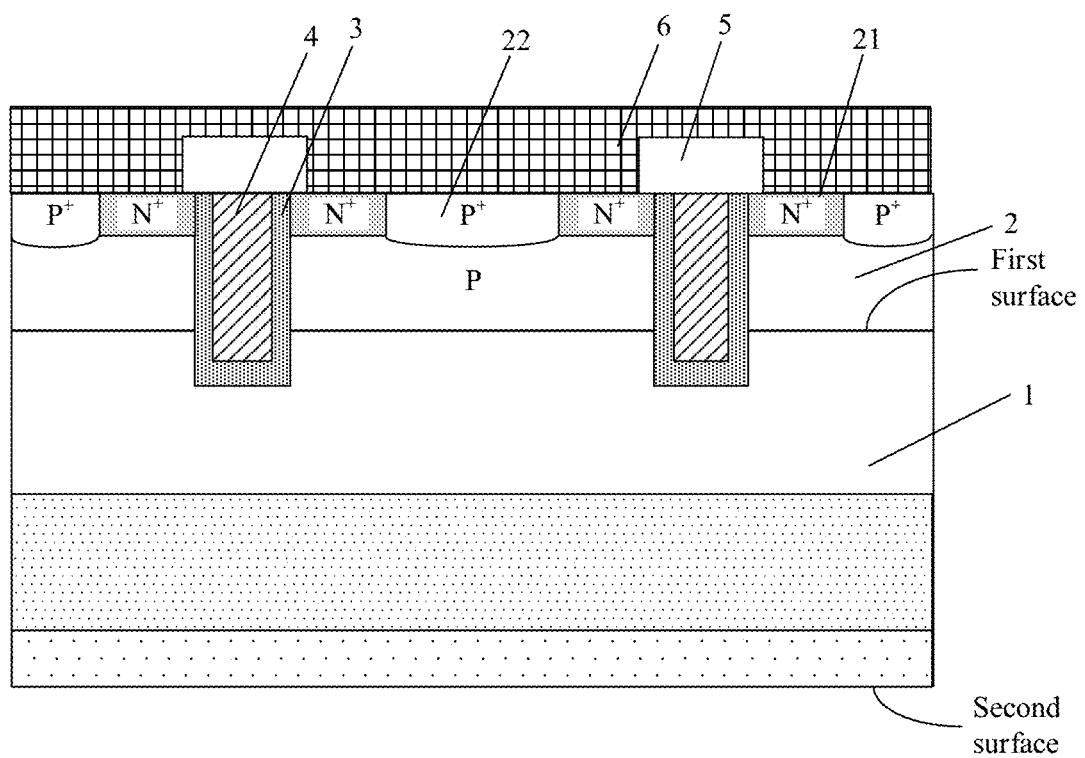
Figure 4E:
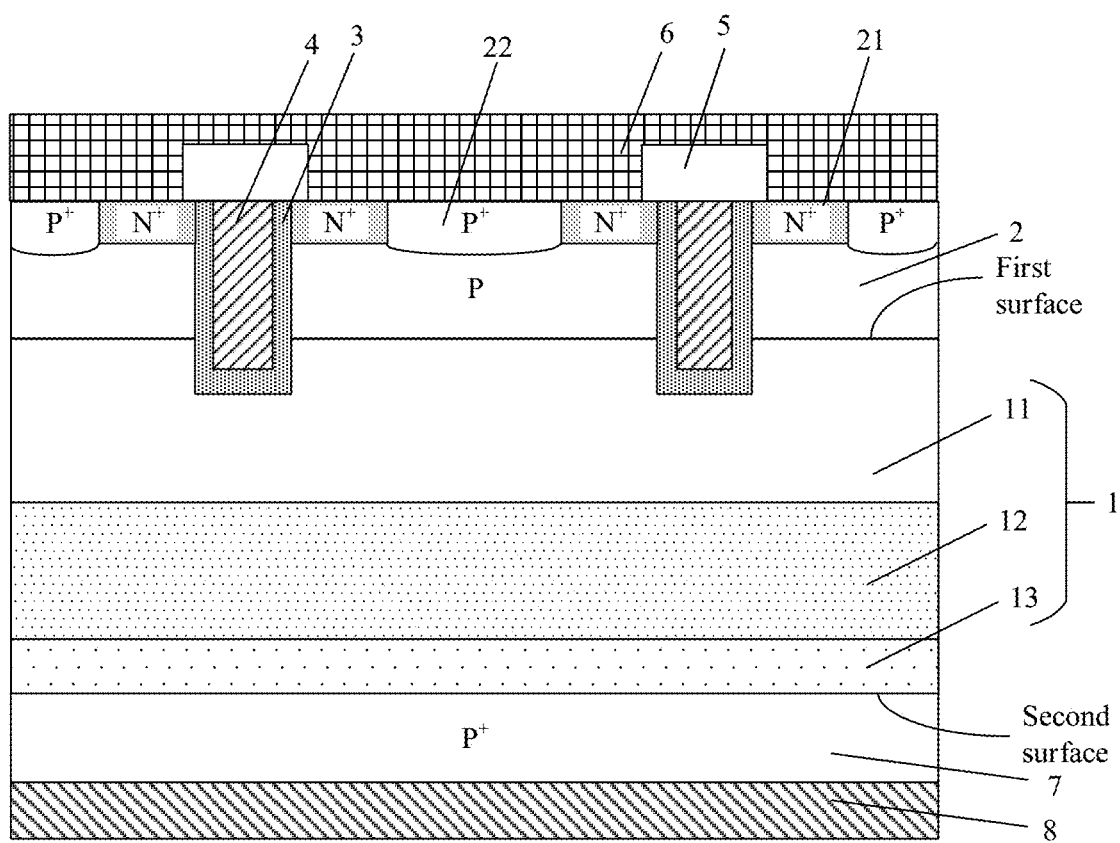

As shown in FIG. 4D, a combination of the first doped region 12 and the second doped region 13 is referred to as a field stop layer, and the N-type substrate 1 between the P-type base layer 2 and the field stop layer may be referred to as the N-type drift layer 11. The N-type drift layer 11 has a lower doping density than the N-type emitter layer 21. Therefore, the N-type drift layer 11 is also referred to as an $N^-$-type drift layer 11, and the N-type emitter layer 21 is also referred to as an N emitter layer.

A particle radius of the first impurity particle is greater than a particle radius of the second impurity particle, and an injection depth of the first impurity particle is greater than an injection depth of the second impurity particle. A depth of the formed first doped region is greater than a depth of the second doped region. Herein, the depth is a distance from the injected impurity particle to the second surface.

The first impurity particle is a hydrogen ion ($H^+$) or a helium ion ($He^+$), and the second impurity particle is a phosphorus atom, an arsenic atom, both of the two, or the like. After the hydrogen ion ($H^+$) is injected into a semiconductor material, a hole/hydrogen-related complex is formed after an annealing operation, and the hydrogen-related complex exists as a donor.

The first injection energy and the second injection energy enable the injection depth of the first impurity particle to be greater than the injection depth of the second impurity particle. The first injection energy and/or the second injection energy may be an energy value, or may be an energy range. In an embodiment, the first injection energy ranges from 50 KeV to 5 MeV, and the second injection energy ranges from 50 KeV to 5 MeV. For example, the first injection energy is 230 KeV to 2 MeV, and the second injection energy is 230 KeV to 2 MeV.

Figure 5A:
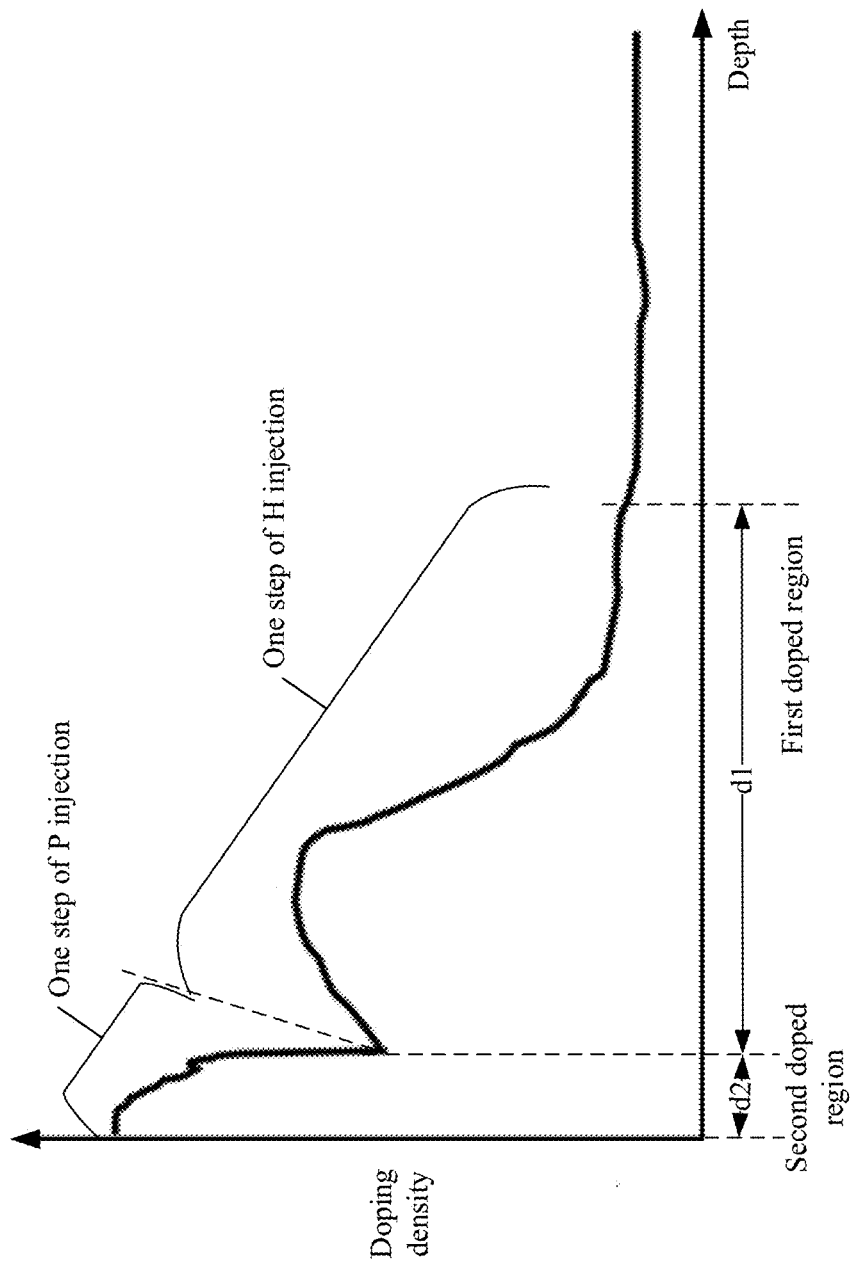
FIG. 5A is a schematic diagram of distribution of a doping density of an impurity at a field stop layer with a depth according to an embodiment of this application.
Figure 5B:
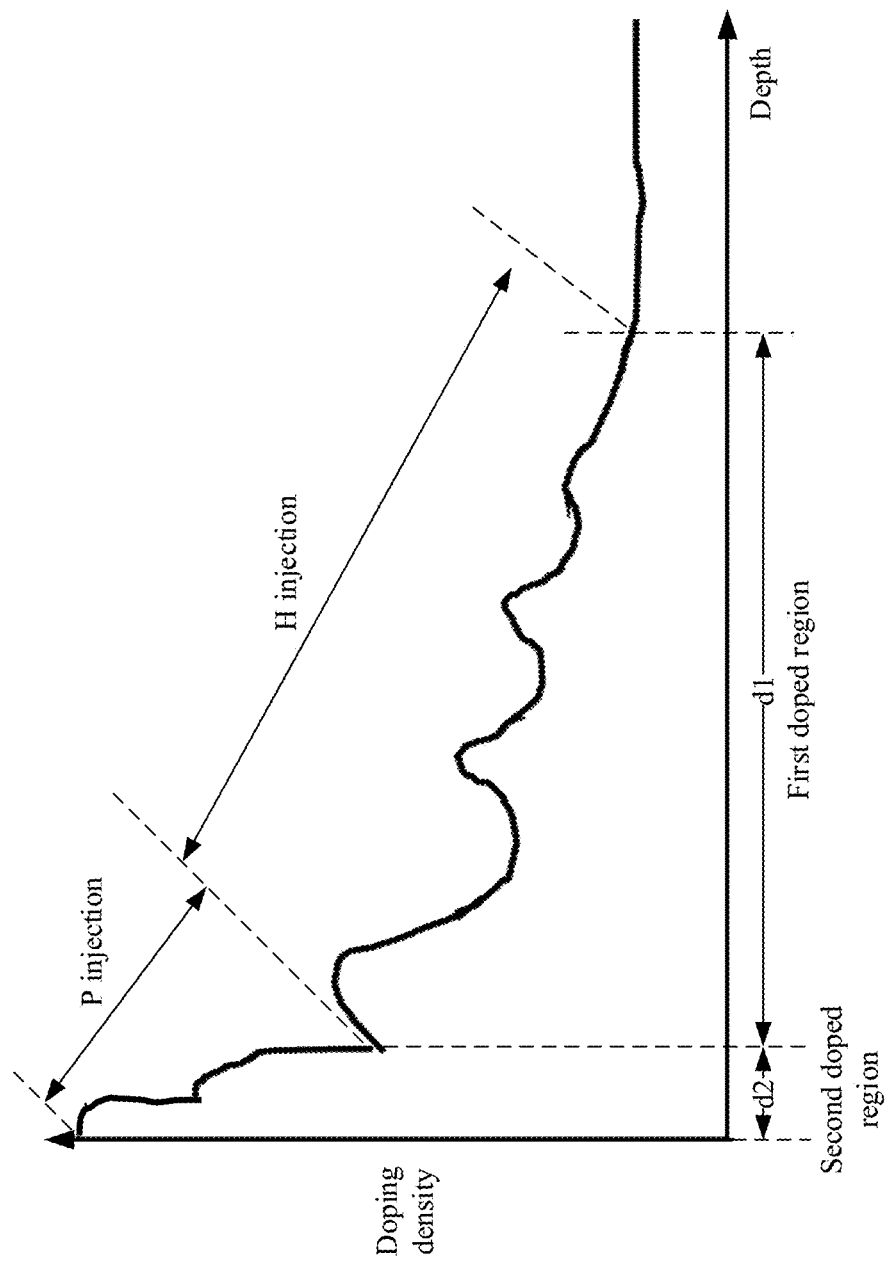
FIG. 5B is another schematic diagram of distribution of a doping density of an impurity at a field stop layer with a depth according to an embodiment of this application.

FIG. 5A and FIG. 5B are schematic diagrams of distribution of a doping density of an impurity at a field stop layer with a depth. In FIG. 5A, both the phosphorus atom and the hydrogen ion are injected by using a single operation. In FIG. 5B, both the phosphorus atom and the hydrogen ion are injected by using a plurality of operations, the hydrogen ion is injected by using four operations, and the phosphorus atom is injected by using two operations. In all operations of injection, injection depths are different and doping densities are also different. In FIG. 5A, the doping density of the phosphorus atom decreases with the depth, and the doping density of the hydrogen ion substantially decreases with the depth. In FIG. 5B, the doping density of the phosphorus atom decreases with the depth in one operation of injection, and increases with the depth in another operation of injection. The doping density of the hydrogen ion continuously changes with the depth, and decreases in terms of an overall trend.

In an embodiment, the injection depth d1 of the first impurity particle is 5 micrometers to 50 micrometers, and the injection depth d2 of the second impurity particle is 2 micrometers to 10 micrometers. It should be understood that for a specific impurity particle, larger injection energy indicates a larger injection depth into the N-type substrate, and longer injection duration or a larger injection dosage indicates a larger doping density of the impurity. In this case, the injection depth of the impurity may be controlled by controlling the injection energy, and the doping density may be controlled by controlling the injection duration or the injection dosage.

In an embodiment, an injection dosage of the first impurity particle ranges from 5E11 to 1E16, and an injection dosage of the second impurity particle ranges from 5E11 to 1E16. A dosage is a total quantity of impurity particles that are injected per unit of area, and is an integral of the doping density of the impurity particle with respect to a depth.

It should be further understood that different impurity particles have different injection depths in case of same injection energy. A larger particle radius of the impurity particle indicates a smaller injection depth. On the contrary, a smaller particle radius of the impurity particle indicates a larger injection depth. Therefore, if the impurity particle has a smaller particle radius, it is easier to inject the impurity particle into a depth of the N-type substrate. In other words, when particles need to be injected into a same depth, more energy is required for injecting the helium ion ($He^+$) than the hydrogen ion ($H^+$).

It should be understood that in case of a same width of a field stop layer, compared with a manner of forming a field stop layer by injecting P, in a manner of forming a field stop layer by injecting the hydrogen ion ($H^+$) or the helium ion ($He^+$), a large injection depth may be obtained without large injection energy, and a field stop layer with a large width is more easily obtained.

It should be noted that the first impurity particle or the second impurity particle may be injected for a plurality of times, and injection for two times is not limited. In addition, S103 and S104 may not be performed in sequence, or may be performed at the same time.

In an embodiment, the first injection energy and injection duration (or the injection dosage) of the first impurity particle may be controlled, so that larger first injection energy indicates a smaller doping density of the first impurity particle. In this method, the doping density of the first impurity particle may substantially decrease in a direction away from the second surface, that is, as shown in FIG. 5A, gradient doping or substantial gradient doping of the first impurity particle is implemented. Gradient doping may reduce voltage stress existing when the IGBT is turned off, to improve voltage resistance of the device, and may further reduce stress generated on the N-type substrate 1 due to doping, to improve performance and a yield of the IGBT.

In an embodiment, the second injection energy and injection duration (or the injection dosage) of the second impurity particle may be controlled, so that larger second injection energy indicates a smaller doping density of the second impurity particle. In this method, the doping density of the second impurity particle may substantially decrease in a direction away from the second surface, that is, as shown in FIG. 5B, gradient doping or substantial gradient doping of the second impurity particle is implemented. This reduces stress generated on the N-type substrate 1 due to doping, to improve performance and a yield of the IGBT.

Compared with a manner of forming the second doped region through epitaxial growth, in the foregoing manner of injecting the second impurity particle, preparation costs can be reduced, and preparation efficiency can be improved. In addition, because the first impurity particle and the second impurity particle are separately injected, the injection depth of the second impurity particle is reduced, and a wafer scrap risk can be reduced.

Operation S105. Form a P-type collector layer 7 on the second surface.

In some embodiments, the P-type collector layer 7 may be formed through epitaxial growth on the second surface, or the P-type collector layer 7 may be formed by injecting an impurity into the second surface.

Operation S106. Form a collector 8 on a surface of the P-type collector layer 7.

In some embodiments, after operations S103, S104, S105, or S106, annealing processing may be performed. It should be understood that annealing processing may be annealing the N-type substrate into which the first impurity particle and the second impurity particle are injected.

In this embodiment of this application, annealing processing may be used to restore a lattice structure and reduce a defect, and may also change an interstitial impurity atom to a substitute impurity atom. Therefore, annealing processing is a necessary process.

In an embodiment, a maximum temperature of the annealing is 200° C. to 500° C. A reason is as follows: After $H^+$ is injected into silicon (Si), $H^+$ can be immediately combined with an impurity, a defect, and a dangling bond in Si to form a plurality of hydrogen-related complexes (H-related complexes). The hole and the hydrogen-related complex form the donor in the field stop region. A doping density depends on a quantity of donors per unit of volume. When annealing is performed at about 200° C., distribution of the hole and the hydrogen-related complex remains basically unchanged. However, after the annealing temperature rises, a density of the hydrogen-related complex decreases quickly, and especially when the annealing temperature exceeds 450° C., a quantity of hydrogen-related complexes decreases by nearly a half. As a result, the hydrogen-related complex recombines with fewer holes in the collector. This causes a larger leakage current.

It may be understood that, when the P atom is deeply injected into the field stop layer, a high annealing temperature is usually required. However, for an IGBT whose field stop layer is formed by injecting P, the high annealing temperature destroys the MOSFET structure on the front surface of the N-type substrate. For an IGBT whose field stop layer is formed by injecting $H^+$, the high annealing temperature reduces the beneficial defect introduced by injecting $H^+$, and increases the leakage current.

According to the IGBT whose field stop layer is formed by injecting both H and P and that is provided in this embodiment of this application, an injection depth of P is shallow, and a very high annealing temperature is not required. Therefore, the MOSFET structure on the front surface of the N-type substrate can be prevented from being damaged. In addition, a decrease of a large quantity of beneficial defects introduced by injecting $H^+$ can be avoided, and the collector-emitter leakage current of the IGBT can be reduced.

FIG. 6A to FIG. 6D are schematic explanatory diagrams in which leakage currents of a plurality of IGBTs vary with a collector-emitter voltage at different temperatures according to an embodiment of this application. In FIG. 6A, FIG. 6B, FIG. 6C, and FIG. 6D, when an IGBT whose field stop layer is formed by injecting H and the IGBT whose field stop layer is formed by injecting both H and phosphorus (P) and that is provided in this embodiment of this application are in a turn-on state, changes of leakage currents $I_{CES}$ of the two IGBTs with a collector-emitter voltage $V_{CE}$ at different temperatures are compared. "25" in "25H injected sample 1" and "25H injected sample 2" means a test temperature, and "H injected sample 1" and "H injected sample 2" are two samples of the IGBT whose field stop layer is formed by injecting H. "H+P injected sample 1" and "H+P injected sample 2" are two samples of the IGBT whose field stop layer is formed by injecting both H and the phosphorus (P) and that is provided in this application, namely, two samples of the semiconductor device shown in FIG. 1 or FIG. 2. FIG. 6A to FIG. 6D respectively show $I_{CES}$-$V_{CE}$ curves for the four samples in the turn-on state at the test temperature of 25° C., 125° C., 150° C., and 175° C.

Figure 6A:
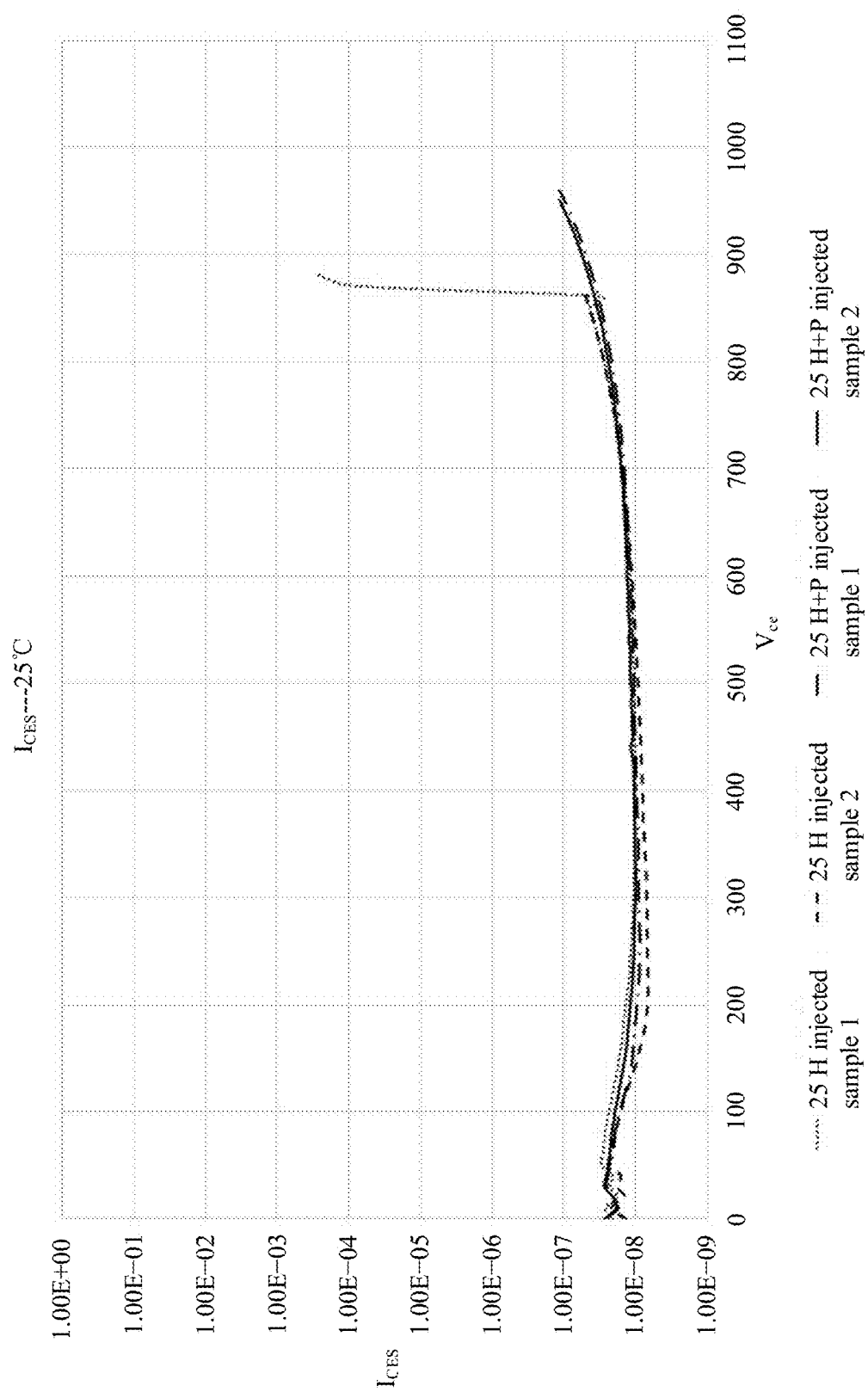
FIG. 6A to FIG. 6D are schematic explanatory diagrams in which leakage currents of a plurality of IGBTs vary with a collector-emitter voltage at different temperatures according to an embodiment of this application.
Figure 6B:
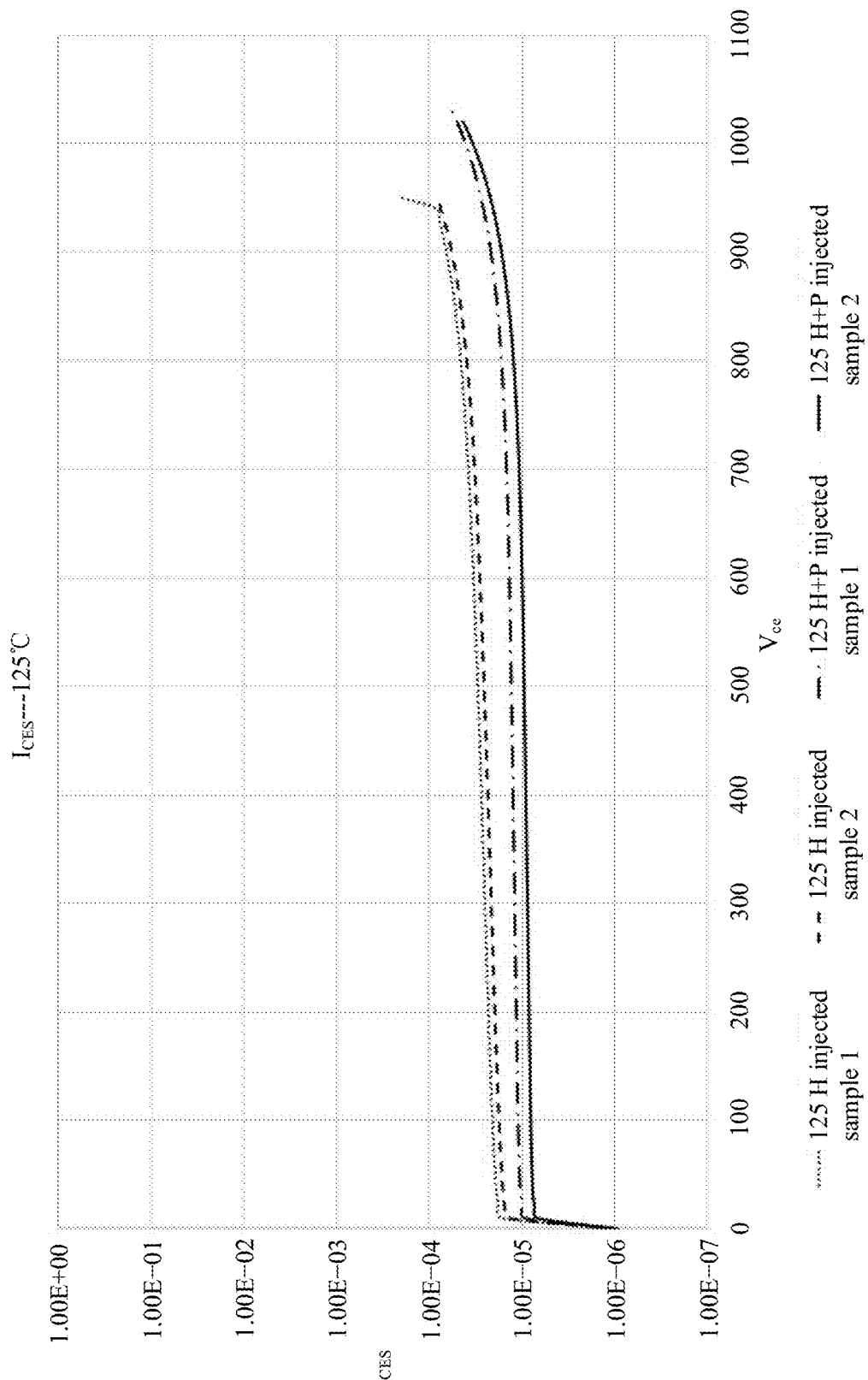
Figure 6C:
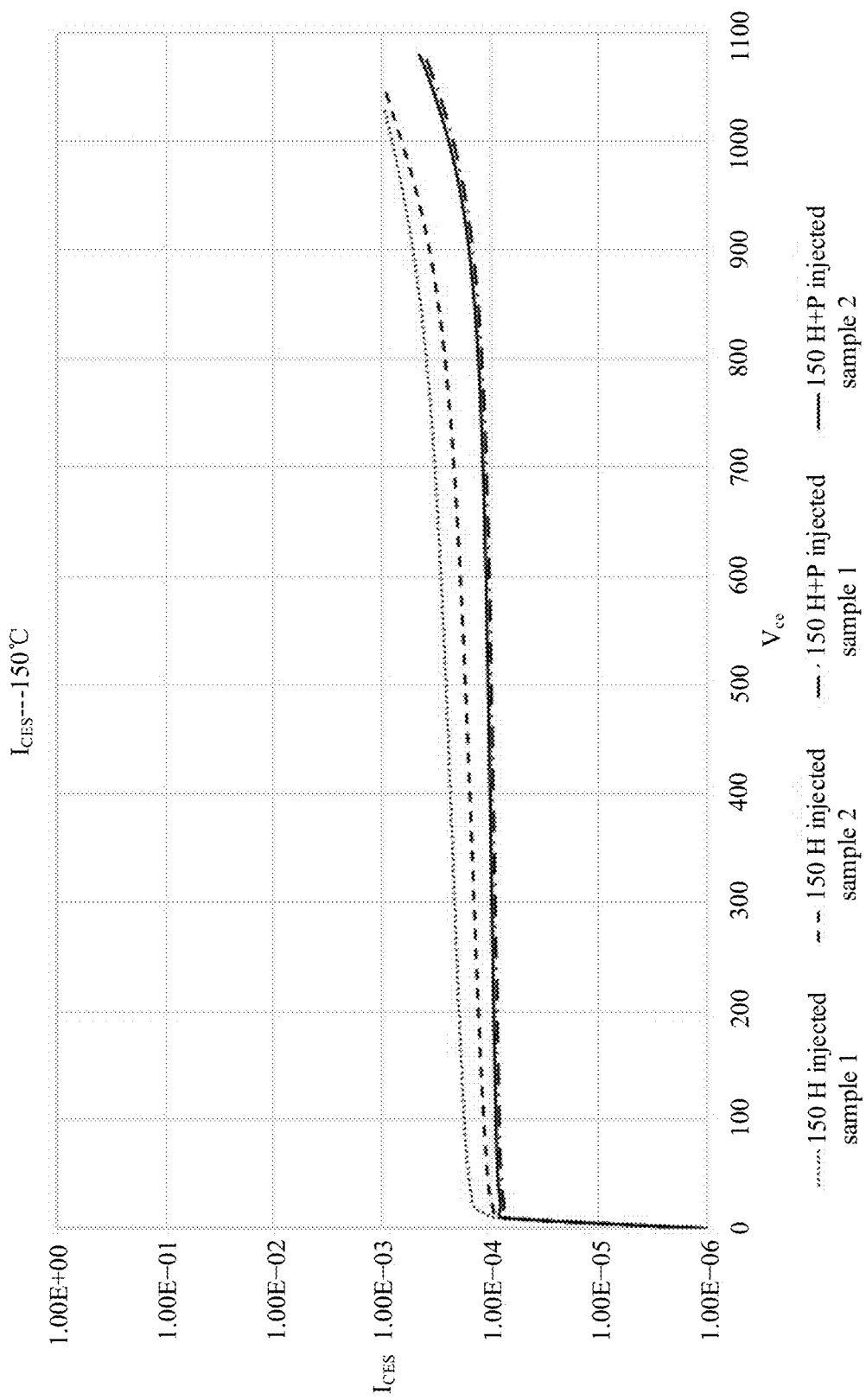
Figure 6D:
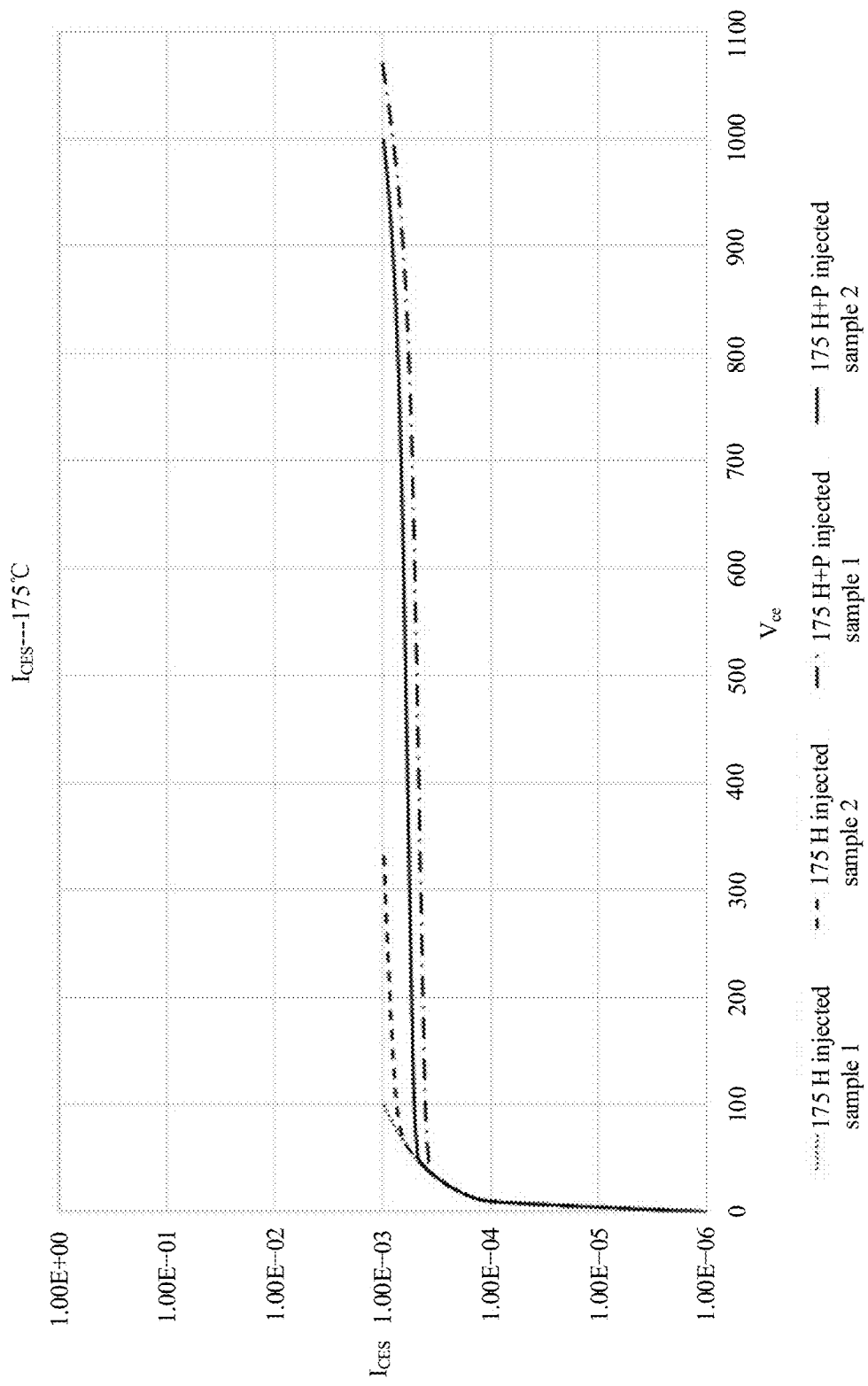

It can be seen from FIG. 6A that, at the normal temperature 25° C., a leakage current of the IGBT whose field stop layer is formed by injecting H is basically the same as a leakage current of the IGBT whose field stop layer is formed by injecting H and the phosphorus (P). It can be seen from FIG. 6B to FIG. 6D that, at 125° C., 150° C., and 175° C., leakage currents of the IGBT whose field stop layer is formed by injecting H and P are less than leakage currents of the IGBT whose field stop layer is formed by injecting H. In addition, as the temperature rises or as the voltage increases, a difference between measured leakage currents of the H injected sample and the H+P injected sample is increasingly large. It may be learned that, according to the IGBT whose field stop layer is formed by injecting both H and P and that is prepared in this embodiment of this application, a problem of a large leakage current of the IGBT whose field stop layer is formed by injecting H can be greatly alleviated.

As a switching device, the IGBT is used in an energy conversion and transmission circuit implementing functions such as frequency conversion, conversion, phase change, rectification, inversion, and switching on a voltage/current. In an application process, the IGBT device may be encapsulated as a power module, for example, an IGBT discrete device, an IGBT module, and an intelligent power module (intelligent power module, IPM). The IGBT discrete device may be a single-tube IGBT, or may be a device including a single-tube IGBT and an anti-parallel diode. The IGBT module is obtained by assembling a plurality of IGBT chips and diode chips into a DBC substrate through insulation and then performing encapsulation. The IPM is a "composite" device that integrates a power device such as an IGBT with a peripheral circuit such as a drive circuit, an overvoltage and overcurrent protection circuit, and a temperature monitoring and overtemperature protection circuit.

The IGBT may be used in a power conversion circuit implementing functions such as frequency conversion, conversion, phase change, rectification, inversion, and switching on a voltage/current, for example, an inverter circuit (inverter circuit), a rectifier circuit (rectifier), or a converter circuit. The following separately describes the circuits and application scenarios thereof.

(1) The inverter circuit is a circuit that converts direct current electric energy into constant frequency and constant voltage alternating current power or frequency-modulated and voltage-regulated alternating current power, and usually includes an inverter bridge, logic control circuit, a filter circuit, and the like. The foregoing IGBT device is used as a switching device of the inverter bridge. The inverter circuit in which the semiconductor device provided in this application is used as a switching device may be applied to a scenario in which a power supply is a direct current power supply and power needs to be supplied to an alternating current load. For example, when a battery in an electric vehicle supplies power to an alternating current motor, electric energy needs to be converted by using the inverter circuit. For another example, before power generated by a solar cell is provided to an alternating current power grid, electric energy needs to be converted by using the inverter circuit.

(2) The rectifier circuit is a circuit that converts alternating current electric energy into direct current electric energy, and usually includes a main circuit, a filter, and a converter. The main circuit may include a rectifier diode and the IGBT device provided in this application. The filter is connected between the main circuit and a load, and is configured to filter out an alternating current component in a pulsating direct current voltage. Whether to dispose the converter depends on a specific case. The converter is configured to: implement matching between an alternating current input voltage and a direct current output voltage, and electrically isolate an alternating current power grid from the rectifier circuit. The rectifier circuit in which the semiconductor device provided in this application is used as a switching device may be applied to a scenario in which alternating current power needs to be converted into direct current power. For example, when an electric vehicle charges a battery, alternating current power may be converted, by using a charging pile or a charger that includes the rectifier circuit, into direct current power that has a rated voltage and that is required by the electric vehicle.

(3) The converter circuit may be a boost converter (Boost Converter) or a buck converter circuit (Buck Converter).

The boost converter is also referred to as a boost converter, and is a direct current-direct current converter that can step up a voltage, and an output (a load) voltage of the boost converter is greater than an input (a power supply) voltage. The boost converter includes at least one diode, at least one transistor, and at least one energy storage element (inductor). The IGBT device provided in this application may be used as a transistor.

The buck converter is also referred to as a buck converter, is a direct current-direct current converter that can step down a voltage, an output (a load) voltage of the buck converter is less than an input (a power supply) voltage, but an output current of the buck converter is greater than an input current. The buck converter includes at least one diode, at least one transistor, and at least one energy storage element (a capacitor, an inductor, or both). In an embodiment, a filter that includes a capacitor may be further added at an output end and an input end to reduce a voltage ripple. The IGBT device provided in this application may be used as a transistor.

For example, a voltage of a solar panel constantly changes due to a time or weather change. To ensure that all solar panels output rated power, the boost converter is added to a photovoltaic inverter, to regulate a voltage that is input to an inverter circuit, so that electric energy emitted by a solar cell is provided to an alternating current power grid.

The foregoing circuits impose no limitation. The semiconductor device that is provided in this application and that is used as a switching device may be applied to another circuit that requires a power semiconductor device, for example, a direct current boost circuit or a direct current buck circuit. This is not limited herein.

The technical terms used in the embodiments of the present disclosure are merely used to describe specific embodiments, but are not intended to limit the present disclosure. In this specification, singular forms "one", "this", and "the" are intended to simultaneously include plural forms unless otherwise clearly specified in the context. Further, the term "including" and/or "containing" used in this specification refers to presence of features, entirety, steps, operations, elements and/or components, but does not exclude presence or addition of one or more other features, entirety, steps, operations, elements and/or components.

In the appended claims, the corresponding structures, materials, actions, and equivalent forms (if any) of all apparatuses or steps and functional elements are intended to include any structure, material, or action that is used to perform the function with reference to other explicitly required elements. The descriptions of the present disclosure are given for the purposes of the embodiments and the descriptions, but are not intended to be exhaustive or limit the present disclosure to the disclosed form.

What is claimed is:

1. A semiconductor device, comprising:
   a P-type collector layer;
   an N-type drift layer; and
   a field stop layer between the P-type collector layer and the N-type drift layer, wherein the field stop layer comprises a first doped region and a second doped region that are successively disposed on a surface of the N-type drift layer, a particle radius of an impurity in the second doped region is greater than a particle radius of an impurity in the first doped region, and doping densities of both the first doped region and the second doped region are higher than a doping density of the N-type drift layer, wherein the impurity in the first doped region is different from the impurity of the second doped region, wherein a doping density of both the first and second doped regions is a gradient doping in a direction away from the P-type collector layer, wherein the doping density of an entire length of the second doped region is a gradient doping in the direction away from the P-type collector layer, wherein the second doped region comprises first and second sublayers defined by peaks in their doping density, the first sublayer is in contact with the first doped region, the second sublayer is in contact with the P-type collector layer, and a doping density of the first sublayer is lower than that of the second sublayer.

2. The semiconductor device according to claim 1, wherein the impurity in the first doped region is a hydrogen ion or a helium ion, and the impurity in the second doped region is a phosphorus atom or an arsenic atom.

3. The semiconductor device according to claim 1, wherein a thickness of the first doped region is greater than a thickness of the second doped region.

4. The semiconductor device according to claim 3, wherein the thickness of the first doped region is 5 micrometers to 50 micrometers, and the thickness of the second doped region is 2 micrometers to 10 micrometers.

5. The semiconductor device according to claim 1, further comprising:
   a P-type base layer, disposed on a surface of the N-type drift layer that faces away from the field stop layer;
   a N-type emitter layer, disposed on a surface of the P-type base layer that faces away from the N-type drift layer; and
   a gate, wherein the gate is connected to the P-type base layer by using an oxide layer.

6. The semiconductor device according to claim 5, wherein
the gate passes through the N-type emitter layer and the P-type base layer; or
the gate is disposed on the surface of the P-type base layer that faces away from the N-type drift layer.

7. A power conversion circuit, comprising:
at least one semiconductor device, wherein the at least one semiconductor device comprises:
a P-type collector layer,
an N-type drift layer, and
a field stop layer between the P-type collector layer and the N-type drift layer, wherein the field stop layer comprises a first doped region and a second doped region that are successively disposed on a surface of the N-type drift layer, a particle radius of an impurity in the second doped region is greater than a particle radius of an impurity in the first doped region, and doping densities of both the first doped region and the second doped region are higher than a doping density of the N-type drift layer, wherein the impurity in the first doped region is different from the impurity of the second doped region, wherein a doping density of both the first and second doped regions is a gradient doping in a direction away from the P-type collector layer, wherein the doping density of an entire length of the second doped region is a gradient doping in the direction away from the P-type collector layer, wherein the second doped region comprises first and second sublayers defined by peaks in their doping density, the first sublayer is in contact with the first doped region, the second sublayer is in contact with the P-type collector layer, and a doping density of the first sublayer is lower than that of the second sublayer.

8. The power conversion circuit according to claim 7, wherein the impurity in the first doped region is a hydrogen ion or a helium ion, and the impurity in the second doped region is a phosphorus atom or an arsenic atom.

9. The power conversion circuit according to claim 7, wherein a thickness of the first doped region is greater than a thickness of the second doped region.

10. The power conversion circuit according to claim 9, wherein the thickness of the first doped region is 5 micrometers to 50 micrometers, and the thickness of the second doped region is 2 micrometers to 10 micrometers.

11. The power conversion circuit according to claim 7, further comprising:
a P-type base layer, disposed on a surface of the N-type drift layer that faces away from the field stop layer;
a N-type emitter layer, disposed on a surface of the P-type base layer that faces away from the N-type drift layer; and
a gate, wherein the gate is connected to the P-type base layer by using an oxide layer.

12. The power conversion circuit according to claim 11, wherein
the gate passes through the N-type emitter layer and the P-type base layer; or
the gate is disposed on the surface of the P-type base layer that faces away from the N-type drift layer.

13. A semiconductor device preparation method, comprising:
providing an N-type substrate having a first surface and a second surface that are disposed oppositely to each other;
forming a P-type base layer, a N-type emitter layer, an oxide layer, and a gate on the first surface, wherein the P-type base layer is disposed on the first surface of the N-type substrate, the N-type emitter layer are disposed on a surface of the P-type base layer that faces away from the N-type substrate, and the gate is connected to the P-type base layer by using the oxide layer;
injecting a first impurity particle and a second impurity particle into the second surface, wherein a particle radius of the first impurity particle is greater than a particle radius of the second impurity particle, and an injection depth of the first impurity particle is greater than an injection depth of the second impurity particle; and
forming a P-type collector layer on the second surface, wherein an impurity in a first doped region is different from an impurity of a second doped region, wherein a doping density of both the first and second doped regions is a gradient doping in a direction away from the P-type collector layer, wherein the doping density of an entire length of the second doped region is a gradient doping in the direction away from the P-type collector layer, wherein the second doped region comprises first and second sublayers defined by peaks in their doping density, the first sublayer is in contact with the first doped region, the second sublayer is in contact with the P-type collector layer, and a doping density of the first sublayer is lower than that of the second sublayer.

14. The method according to claim 13, wherein the impurity in the first doped region is an hydrogen ion or a helium ion, and the impurity in the second doped region is a phosphorus atom or an arsenic atom.

15. The method according to claim 13, wherein the injecting a first impurity particle and a second impurity particle into the second surface comprises:
injecting the first impurity particle into the second surface by using first injection energy; and
injecting the second impurity particle into the second surface by using second injection energy, wherein
the first injection energy and the second injection energy enable the injection depth of the first impurity particle to be greater than the injection depth of the second impurity particle.

16. The method according to claim 15, wherein the injection depth of the first impurity particle is 5 micrometers to 50 micrometers, and the injection depth of the second impurity particle is 2 micrometers to 10 micrometers.

* * * * *